United States Patent [19]

Kurosawa et al.

[11] Patent Number: 4,985,117
[45] Date of Patent: Jan. 15, 1991

[54] METHOD OF MANUFACTURING JOSEPHSON JUNCTIONS

[75] Inventors: Hideyuki Kurosawa, Kumagaya; Toshio Hirai; Hisanori Yamane, both of Sendai; Tsutomu Yamashita, Nagaoka, Japan

[73] Assignees: Kabushiki Kaisha Riken; Research Development Corporation of Japan, both of Tokyo, Japan

[21] Appl. No.: 473,406

[22] Filed: Jan. 1, 1990

[30] Foreign Application Priority Data

Feb. 4, 1989 [JP] Japan .................................. 1-24773
Aug. 31, 1989 [JP] Japan ................................ 1-225322

[51] Int. Cl.$^5$ .......................... B44C 1/22; B05D 5/12; C23C 14/00; C23F 1/02
[52] U.S. Cl. ................................. 156/659.1; 156/656; 156/667; 427/62; 427/63; 505/817; 505/819; 505/820
[58] Field of Search ................. 427/62, 63; 204/192, 204/24; 505/1, 817, 819, 820; 156/656, 659.1, 662, 663, 667

[56] References Cited

U.S. PATENT DOCUMENTS 4,255,465 3/1981 Bernard et al. ................. 505/819 X
4,861,750 8/1989 Nogawa et al. ...................... 505/1
4,912,087 3/1990 Aslam et al. ........................ 505/1

OTHER PUBLICATIONS

Japanese Journal of Applied Physics, vol. 26, No. 11, Nov., 1987, pp. L1925–L1926, Nakane, Tarutani, Nishino, Yamada and Kawabe.
Japanese Journal of Applied Physics, vol. 26, No. 12, Dec., 1987, pp. L1961–L1963, Tanabe, Kita, Yoshizako, Tonouchi and Kobayashi.
Quantun Interference Devices made from Superconducting Oxide Thin Films; Koch, Umbach, Clark, Chaudhuri & Laibowitz, IBM, published 5/22/87.
IEEE Transactions on Magnetics, vol. 25, No. 2, Mar. 1989, Hilton, Schweinfurth & Van Harlingen.

Primary Examiner—William A. Powell
Attorney, Agent, or Firm—Finnegan, Henderson, Farabow, Garrett, and Dunner

[57] ABSTRACT

A method of manufacturing Josephson junctions includes steps of high Tc superconductor thin films on a substrates by chemical vapor deposition using raw materials, which includes at least yttrium, barium and copper, serving as vapor generating sources, and fabricating the high Tc superconductor thin films into microbridges to produce Josephson junctions.

13 Claims, 7 Drawing Sheets

METHOD OF MANUFACTURING JOSEPHSON JUNCTIONS

BACKGROUND OF THE INVENTION

This invention relates to a method of manufacturing Josephson junctions of high Tc superconductor.

Josephson junctions being known to exhibit unique current-voltage characteristics are important elements in the field of superconducting electronics. In particular, owing to discovery of high Tc superconductors ($YBa_2Cu_3O_{7-y}$) which exhibit a superconducting transition at temperatures above the boiling point of liquid nitrogen, advances are being made in research and development for utilizing Josephson junction devices, which make use of these high Tc superconductors and operate at the boiling point of liquid nitrogen, in a greater number of fields. Josephson junctions include those of the tunnel junction-type, point contact-type and bridge-type structure, and similar structures have been considered for use in high Tc superconductors. However, with the tunnel junction-type structure, the coherent length of the high Tc superconductor is short, as a result of which the thickness of the tunnel barrier is required to be made as thin as tens of angstroms. The point contact-type structure involves difficulty in terms of reproducibility and integration, while the bridge-type structure requires lift-off techniques on the submicron under. For these reasons, most Josephson junctions in the high Tc superconductors presently being developed make use of the grain boundarys of the high Tc superconductor itself, as in a micro-bridge or break junction. In order to form Josephson junctions which utilizes the grain boundary, it is necessary for the superconductor to be formed as thin films. Specifically, by employing a vacuum deposition method typified by a sputtering method or electron beam deposition method, thin films of polycrystalline high Tc superconductors are formed and the grain boundarys thereof are used to fabricate a Josephson junctions.

However, owing to the overall quality of the film, the alignment of the grain boundary present at portions other than the Josephson junction, the alignment of the grain boundary forming the Josephson junction and the precipitation of impurities at the grain boundary, the characteristics of the Josephson junctions are not satisfactory. Accordingly, the aforementioned method of manufacturing Josephson junctions are in need of improvement.

SUMMARY OF THE INVENTION

An object of the present invention is to provide a method of manufacturing Josephson junctions based on the high Tc superconductor whose characteristics are improved by forming films exhibiting improved film quality, excellent alignment and fewer impruities residing at the grain boundary.

According to the present invention, the foregoing object is attained by forming thin films of the high Tc superconductor by chemical vapor deposition using raw materials of a vapor sources which included at least yttrium, barium and copper.

More specifically, the foregoing object is attained by providing a method of manufacturing Josephson junctions in which β-diketonate chelates of the elements yttrium, barium and copper are used as the raw materials. The raw materials constituting these three ingredients are heated to temperatures at which the respective vapor pressures of these elements are obtained, and the vapors are introduced to a reaction vessel along with a carrier gas. The carrier gas employs an inert gas such as argon gas or nitrogen gas. Oxygen gas or a gas containing oxygen is introduced to the vessel by piping separate from that used to introduce the vapors of the three ingredients. The substrates for forming the films are placed within the reaction vessel and the substrates are heated. The substrates should be one having a coefficient of thermal expansion close to that of the film without the substrates reacting with the film at least when the film formed. Examples of the substrate are polycrystal or single-crystal substrates of strontium titanate, magnesia, stabilized zirconia or lanthanum aluminate. The substrates are heated within the reaction vessel by placing a heater inside the vessel or from outside the vessel by an external heater. Other heating means such as high-frequency heating may be employed. The temperature to which the substrates are heated is within a range which will sufficiently decompose and polymerize the vapors of the three ingredients to enable formation of the thin films of a crystalline high Tc superconductor without degrading the superconducting characteristics due to reaction between the substrates and the films. A preferred temperature range is 700°–850° C. The interior of the reaction vessel is maintained at reduced pressure, specifically a pressure which will provide a gas flow velocity at which the substrates can be sufficiently supplied with the vapors of raw material. Though the pressure used depends upon the set-up and the carrier gas flow rate, 10 Torr is preferred. Film thickness can be controlled at will be adjusting deposition time, raw material heating temperature and carrier gas flow rate. Since a Josephson junction element requires the films exhibiting excellent flatness, the deposition rate preferably is made as slow as possible. A desirable deposition rate is no more than 2 μm per hour.

The composition of the superconductor can be controlled by adjusting the temperatures to which the raw materials are heated as well as the flow rate of the carrier gas. The composition ratio is yttrium:barium:copper=1:2:3, and it is arranged so that other phases will not deposit as impurities at the grain boundary, and so that the overall superconducting characteristics of the film will not deteriorate. It is preferred that any shift in the composition ratio of the three elements be controlled so as not to exceed a range of several percent. In addition, the oxygen content in the superconductor is controlled by regulating the partial pressure of oxygen, which is accomplished by adjusting the amount of oxygen introduced. After deposition, cooling is performed at the partial pressure of oxygen which prevailed at deposition, at atmospheric pressure or at an oxygen partial pressure of one atmosphere. Cooling can be performed gradually at 1° C./min or rapidly at 30° C./min.

The superconductor thin films having thickness of 0.5–1 μm formed by the above-described method are etched to form the required Josephson junctions. The etching process can be carried out in the usual method Examples are dry etching and wet etching. The width of the micro-bridge portion for forming the Josephson junction is made 1–10 μm. Preferably, the width is 1 μm and the length 1 μm.

In order to improve superconductivity, particularly the critical current density, the film formed should be an oriented film, such as a c-axis oriented film in which the c axis is oriented perpendicular to the substrate. Also acceptable is an oriented film in which the a axis is mixed in slightly with the c-axis orientation, an a-axis oriented film, etc.

Other features and advantages of the present invention will be apparent from the following description taken in conjunction with the accompanying drawings.

DESCRIPTION OF THE PREFERRED EMBODIMENTS

Embodiment 1

Embodiments of the present invention will now be described with reference to FIGS. 1 through 5.

Figure 1:
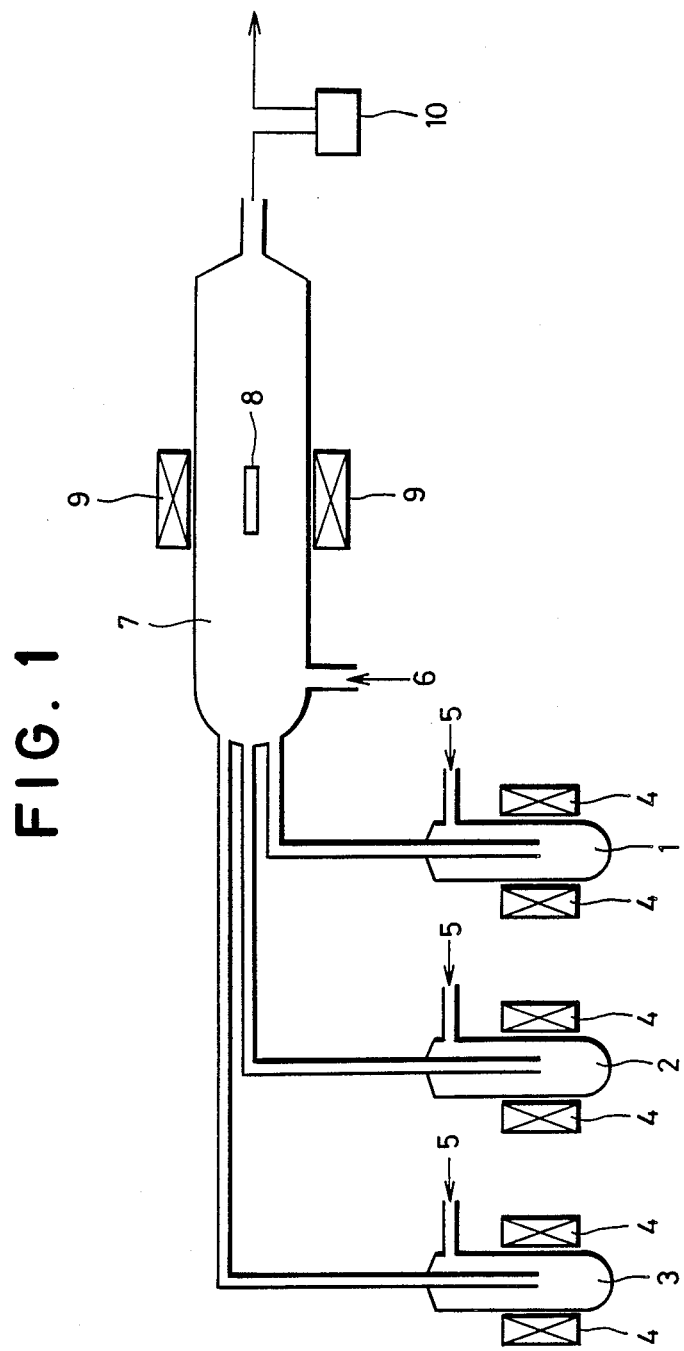
FIG. 1 is a sectional view illustrating an apparatus capable of being used to carry out the manufacturing method of the present invention.
Figure 2:
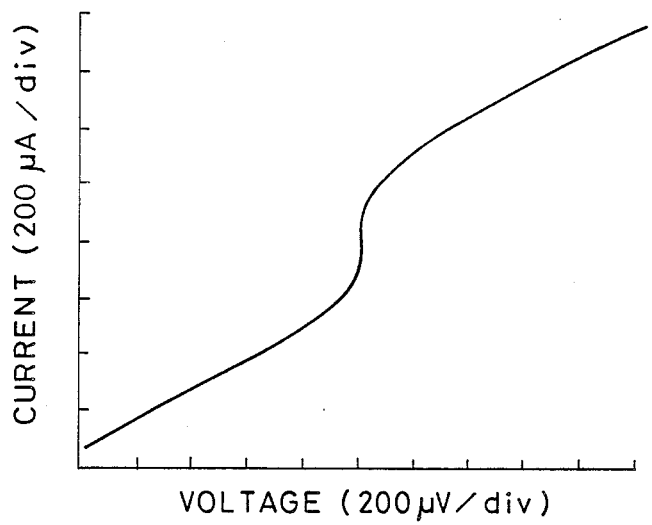
FIG. 2 shows an I-V characteristic of a Josephson junction without microwave radiation according to the present invention.
Figure 3:
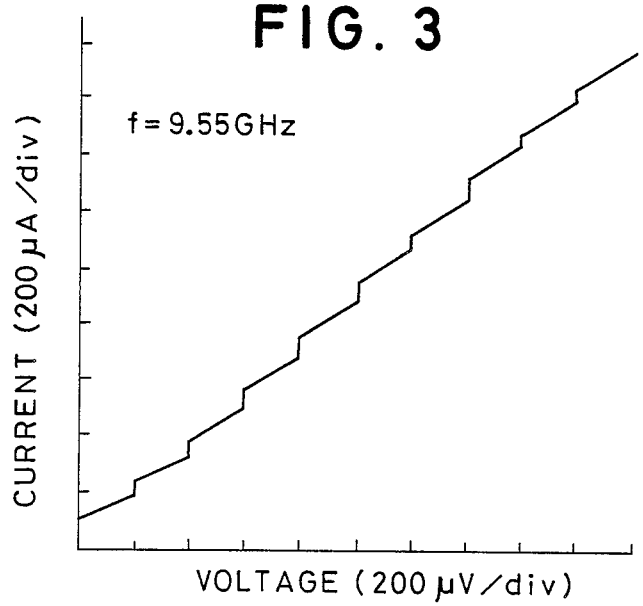
FIG. 3 shows an I-V characteristic of the Josephson junction with microwave radiation according to the present invention.

FIG. 1 shows an example of manufacturing a film in accordance with the present invention. As shown in FIG. 1, yttrium, barium and copper $\beta$-diketonate chelates $Y(C_{11}H_{19}O_2)_3$, $Ba(C_{11}H_{19}O_2)_2$ and $Cu(C_{11}H_{19}O_2)_2$ were introduced to raw material vessels 1, 2 and 3 where they were heated to respective temperatures 134° C., 252° C. and 133° C. by a heater 4. Argon gas serving as an inert gas was supplied to each of the raw material vessels 1, 2 and 3 from inert gas introduction ports 5 at a rate of 150 ml/min. Oxygen gas was supplied to a reaction vessel 7 from an introduction port 6 at a rate of 250 ml/min. The carrier gas containing the vapor of each $\beta$-dikeytone chelate was mixed with the oxygen gas inside the reaction vessel 7, and the gas mixture was introduced to an MgO (100) single-crystal substrate 8. The latter was heated to 850° C. by a substrate heater 9. The pressure within the reaction vessel 7 was made 10 Torr by means of a vacuum pump 10. As a result of the foregoing procedure, a film was allowed to deposit on the substrate 8 for 1 hr, and cooling was performed at a rate of 15° C./min.

Figure 4A:
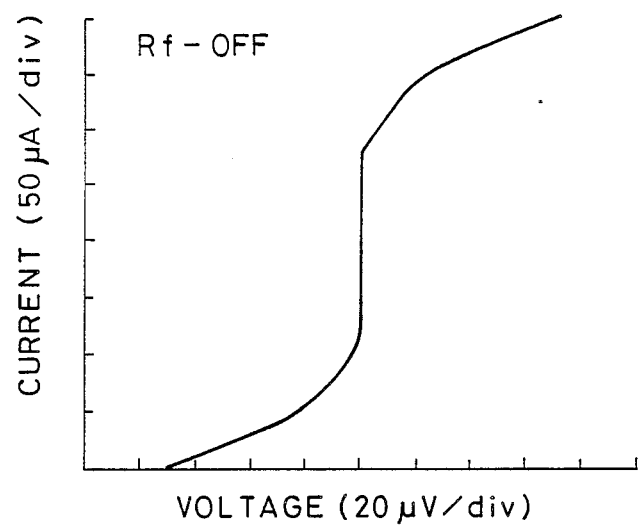
FIGS. 4A and 4B are graphs showing microwave power dependence of the Josephson junction according to the present invention.
Figure 4B:
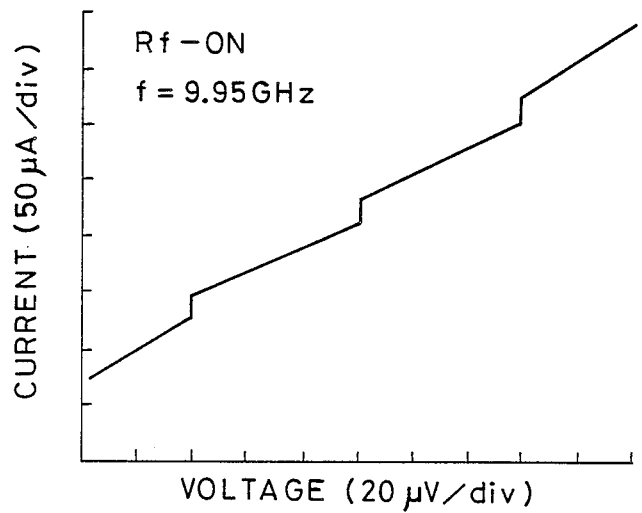

A micro-bridge pattern was formed in the film by a photolithography, and the film was etched using an aqueous solution of 5% phosphoric acid to form a micro-bridge having a width of 3 $\mu$m, thereby manufacturing a Josephson junction element. The Josephson junction exhibits a current (I) - voltage (V) characteristic of the kind shown in FIG. 2 and, by being radiated with 9.95 GHz microwave at 77K, an I-V characteristic of the kind shown in FIG. 3, in which Shapiro steps are clearly observed up to high voltage. FIGS. 4A and 4B illustrate the dependence of current (I) upon the power of microwave at 77K. FIG. 4A shows the I-V characteristic at a power of zero, and FIG. 4B the I-V characteristic when power is applied. It is shown that current (Ic) varies depending upon the power of microwave and therefore is dependent upon the power of microwave. Accordingly, it will be understood that a Josephson junction was formed at the micro-bridge portion.

Embodiment 2

Figure 5:
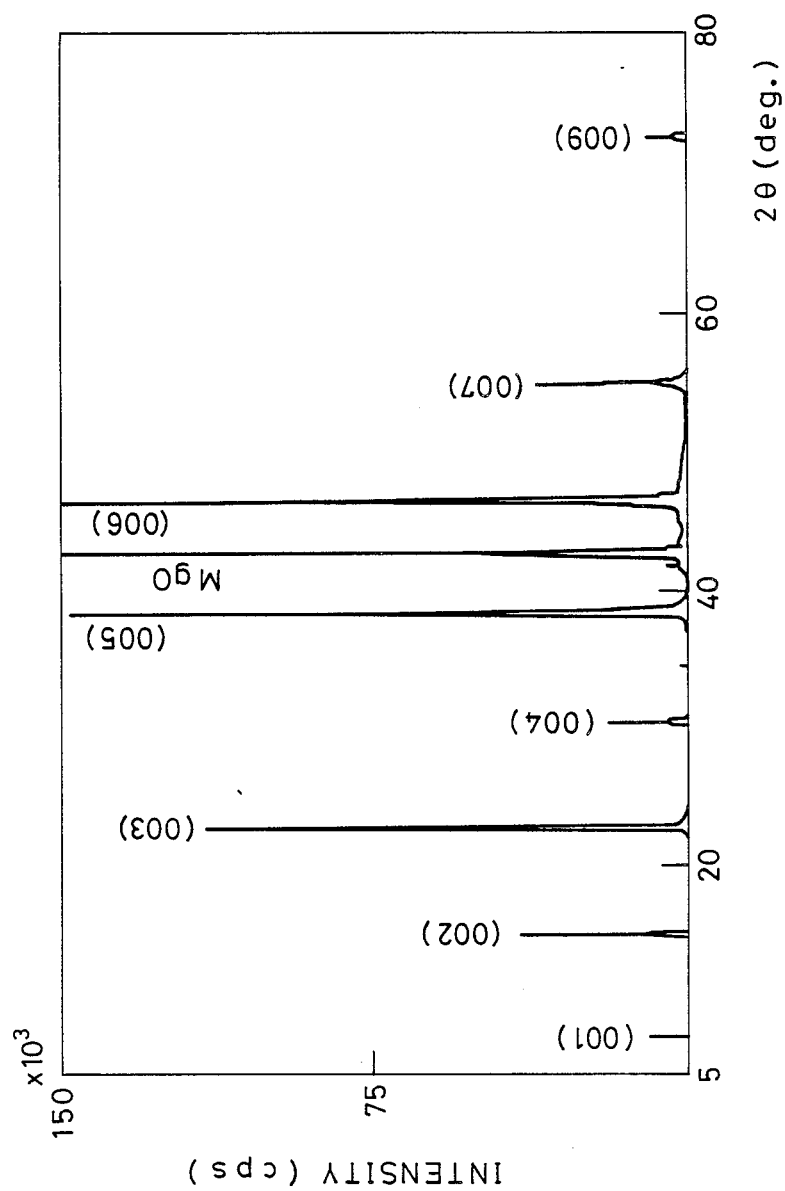
FIG. 5 shows an X-ray diffraction pattern of a thin film according to the present invention.
Figure 6:
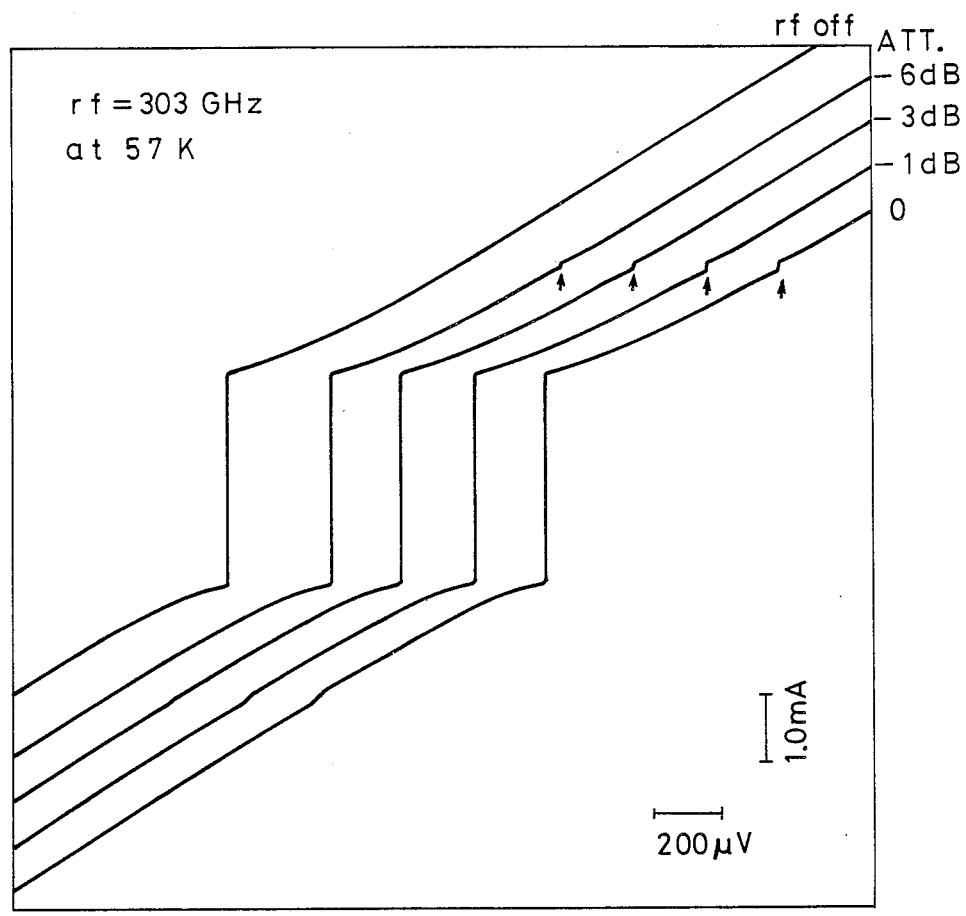
FIG. 6 shows an I-V characteristic of the Josephson junction with microwave radiation for various power according to the present invention.

With reference again to FIG. 1, the yttrium, barium and copper $\beta$-diketonate complexes $Y(C_{11}H_{19}O_2)_3$, $Ba(C_{11}H_{19}O_2)_2$ and $Cu(C_{11}H_{19}O_2)_2$ were introduced to the raw material vessels 1, 2 and 3 where, in this embodiment, they were heated to respective temperatures of 133° C., 248° C. and 130° C. by the heater 4. As in the first embodiment, the argon gas was supplied to the vessels 1, 2 and 3 at the rate of 150 ml/min, the oxygen gas was supplied to the reaction vessel 7 at the rate of 250 ml/min, the vapors of the $\beta$-dikeytone chelates were mixed with the oxygen gas inside the reaction vessel 7, the gas mixture was introduced to the MgO (100) single-crystal substrate 8 heated to 850° C., the reaction vessel 7 was depressurized to 10 Torr, a film was deposited on the substrate 8 for 1 hr, and cooling was performed at the rate of 15° C./min. The film formed in this embodiment had a thickness of 1 $\mu$m. FIG. 5 shows an X-ray diffraction pattern of this thin film. The critical temperature of the film is 81K, and the critical current density is on the order of $10^4/cm^2$. A bridge pattern was formed in the resulting thin film by a photoresist, and the film was etched using an aqueous solution of 5% phosphoric acid to form a bridge having a width of 1 $\mu$m and a length of 1 $\mu$m, thereby manufacturing a Josephson element having a single Josephson junction. By being irradiated with electromagnetic waves at a frequency of 303 GHz, the Josephson element exhibits an I-V characteristic of the kind shown in FIG. 6. Shapiro steps are clearly observed at about 600 $\mu$v.

Embodiment 3

Figure 7:
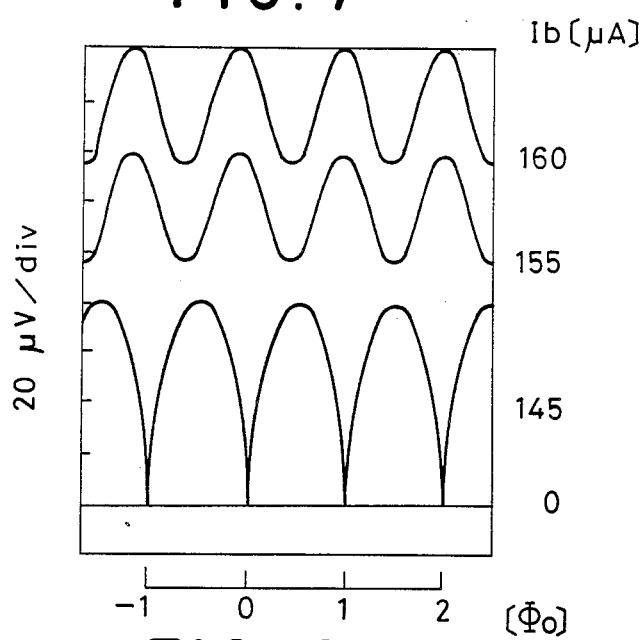
FIGS. 7, 8 and 9 show V-$\Phi$ characteristics of dc-SQUID make use of Josephson junctions according to the present invention.
Figure 8:
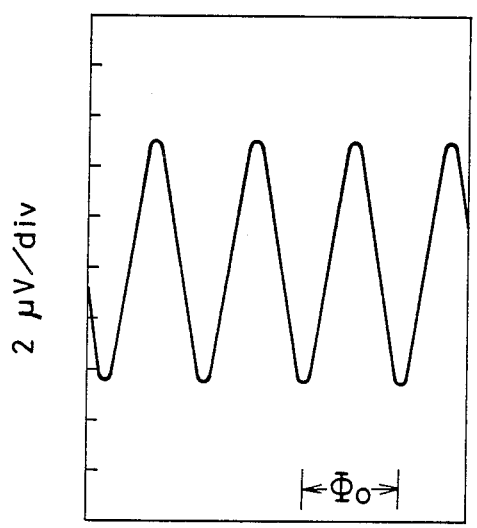

A film was deposited on an MgO (100) single-crystal substrate by a thin-film forming method similar to that of Embodiment 2. The critical temperature of the film is 81K. The central portion of the thin film was etched to a size of 25 $\mu$m × 25 $\mu$m by photolithography and chemical etching to form the loop of a SQUID. At the portion of the Josephson junction a bridge having a width of about 1 $\mu$m and a length of 1 $\mu$m was formed at each of the two ends of the SQUID loop to fabricate a dc-SQUID. FIG. 7 illustrates the V-$\Phi$ characteristic of the dc-SQUID at 4.2K. A voltage change of about 80 $\mu$V was observed when a biasing current of 145 $\mu$A was applied. FIG. 8 illustrates the V-$\Phi$ characteristic of the element at 60K. A periodic voltage changed was observed with respect to $\Phi_0$ even at 60K.

Embodiment 4

Figure 9:
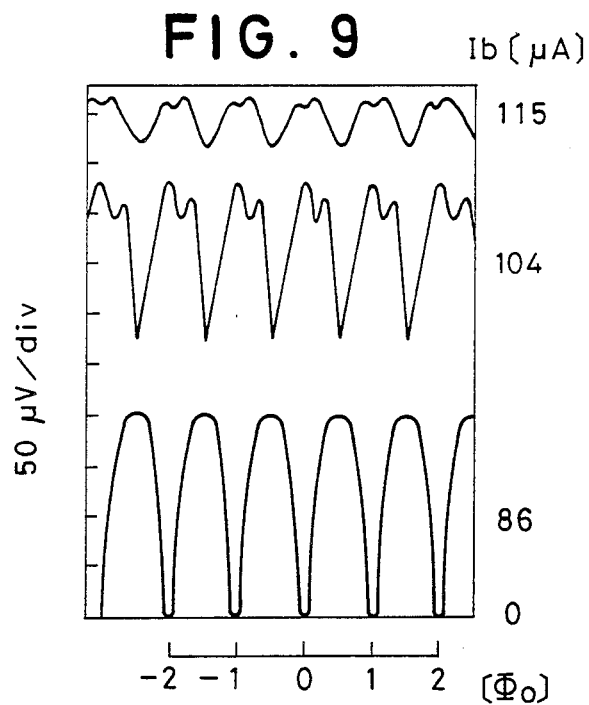
Figure 10:
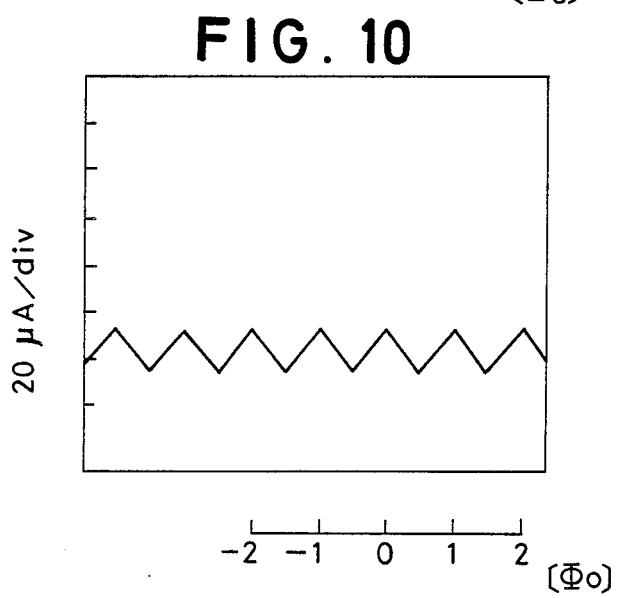
FIG. 10 shows an Ic-$\Phi$ characteristics of dc-SQUID make use of Josephson junctions according to the present invention.

A dc-SQUID was fabricated by a method similar to that of Embodiment 3. FIG. 9 illustrates the V-$\Phi$ characteristic of the dc-SQUID at 4.2K. A periodic, stable voltage change was observed with respect to $\Phi_0$ even in this embodiment. An Ic-$\Phi$ characteristic shown in FIG. 10 was observed in this element.

The Josephson junctions produced in accordance with the present invention is advantageous in that the characteristics thereof have better reproducibility and better controllability in comparison with the prior art.

What is claimed is:

1. A method of manufacturing a thin film Josephson junction, comprising the steps of:
    heating β-diketonate complexes of yttrium, borium, and copper elements each in a separate raw material vessel to a temperature corresponding to the vapor phase temperature of the respective elements;
    heating a substrate in a reaction vessel to a temperature corresponding to a temperature suitable for decomposing and polymerizing said vapors;
    supplying an inert carrier gas to each raw material vessel at a predetermined flow rate;
    mixing in the reaction vessel the inert carrier gas and vapors from each of the raw material vessels with oxygen;
    subjecting the heating substrate to the mixture of the vapors and inert gas and oxygen for a time period in accordance with the desired thickness of the thin film;
    cooling the substrate at a predetermined rate; and
    forming a micro bridge pattern in said thin film to provide the Josephson junction.

2. The method of claim 1 wherein the step of forming the micro-bridge pattern includes etching a pattern having a width in the range of one to ten microns.

3. The method of claim 1 wherein the step of forming the micro-bridge pattern includes providing a crystalline grain boundary at a junction of the micro-bridge and thin film.

4. The method of claim 1 wherein the step of heating the substrate includes heating the substrate to a temperature in the range of 700° to 850° C., and the step of mixing in the reaction vessel includes reducing the pressure in the reaction vessel a selected amount.

5. The method according to claim 1 wherein the step of heating the substrate includes heating an MgO (100) single-crystal substrate the step of subjecting the heating substrate to the vapor mixture includes selecting a time period for providing a thin film having a thickness of one-half to one micron, and the step of forming the micro-bridge pattern includes etching a pattern having a length of one micron and a width of one micron.

6. The method of claim 1 wherein the step of subjecting the heating substrate to the mixture includes depositing a thin film having a c-axis orientation.

7. The method of claim 1 wherein the step of heating the β-diketonate includes heating Y $(C_{11}H_{19}O_2)$ to approximately 133° C. to 134° C., Ba $(C_{11}H_{19}O_2)_2$ to approximately 248° C. to 252° C., Cu$(C_{11}H_{19}O_2)_2$ to approximately 130° C. to 133° C.

8. The method of claim 1 wherein the step of heating the substrate includes heating a crystalline substrate having a coefficient of expansion approximating the coefficient of expansion of the thin film.

9. The method of claim 8 wherein the step of heating the substrate includes heating a substrate composed of one of the materials selected from the group consisting of strontium titanate, stabilized zirconia, and lanthanum aluminate.

10. The method of claim 1 wherein the step of mixing with oxygen in the reaction vessel includes introducing the oxygen into the reaction vessel separate from the vapor and the inert gas.

11. The method of claim 1 wherein the step of subjecting the heated substrate to the mixture of oxygen and inert gas and vapor for a selected time further includes controlling the composition of the thin film by varying the temperatures of the elements in the raw material vessels and the flow rate of the inert carrier gas.

12. The method of claim 1 wherein the step of mixing the inert gas and vapors with oxygen in the reaction vessel includes supplying three parts of β-diketonate of copper and two parts of β-diketonate of barium for very one part of β-diketonate of yttrium.

13. The method of claim 1 wherein the step of cooling includes cooling the thin film and substrate at a rate in the range of approximately 1° C. to 30° C. per minute.

* * * * *